(12) United States Patent
Beck et al.

(10) Patent No.: US 8,818,776 B2
(45) Date of Patent: Aug. 26, 2014

(54) SYSTEM AND METHOD FOR DOWNHOLE TOOL SYSTEM DEVELOPMENT

(75) Inventors: Harold Kent Beck, Copper Canyon, TX (US); Kenneth L. Schwendemann, Flower Mound, TX (US); David R. Larimore, Dallas, TX (US); Brandon B. Beaver, Red Oak, TX (US); Alexander G. Krasovsky, Dallas, TX (US); Darrin N. Towers, Carrollton, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 3106 days.

(21) Appl. No.: 11/200,381

(22) Filed: Aug. 9, 2005

(65) Prior Publication Data

US 2007/0038376 A1    Feb. 15, 2007

(51) Int. Cl.
*G06G 7/48* (2006.01)
*E21B 47/00* (2012.01)

(52) U.S. Cl.
CPC .................................. *E21B 47/00* (2013.01)
USPC .......................................................... 703/10

(58) Field of Classification Search
USPC .......................................................... 703/10
See application file for complete search history.

(56) References Cited

U.S. PATENT DOCUMENTS

| | | | |
|---|---|---|---|
| 4,931,929 A | 6/1990 | Sherman | |
| 6,169,967 B1 | 1/2001 | Dahlem et al. | |
| 6,305,475 B1 * | 10/2001 | Carnahan | 166/313 |
| 6,497,290 B1 * | 12/2002 | Misselbrook et al. | 166/384 |
| 6,785,641 B1 | 8/2004 | Huang | |
| 2002/0049575 A1 | 4/2002 | Jalali et al. | |
| 2004/0251898 A1 * | 12/2004 | Morys et al. | 324/303 |
| 2005/0015229 A1 | 1/2005 | Huang | |

OTHER PUBLICATIONS

"Projects in VR," Julien Berta. Sep./Oct. 1999. IEEE.*
Beck et al. "Unique Simulation Development Enhances Safer Operation for Downhole Well Test Tools", SPE 35691, 1996.*
International Search Report, PCT/US2006/030948, Sep. 13, 2007.
Foreign Communication from a Counterpart Application; PCT Application No. PCT/US2006/030948; International Preliminary Report on Patentability; Feb. 12, 2008; 6 pages.

* cited by examiner

*Primary Examiner* — Saif Alhija (57) ABSTRACT

A disclosed method of downhole tool system development comprises: receiving specifications of a downhole tool system that comprises multiple strings, each string having one or more components; and checking for interference between the multiple strings in an initial position. A disclosed system comprises: a memory that stores software; and a processor coupled to the memory to execute the software. The software causes the processor to provide a graphical user interface that enables a user to specify a downhole tool system having multiple strings, and to test the strings for diametrical overlap attributable to relative motion of the strings.

24 Claims, 8 Drawing Sheets

SYSTEM AND METHOD FOR DOWNHOLE TOOL SYSTEM DEVELOPMENT

BACKGROUND

Oilfield service companies employ sophisticated equipment to develop wells. The equipment often takes the form of one or more downhole tool systems attached to tubular strings in the borehole. During a completion operation, for example, a borehole may have a casing string, a completion string, and a service string. The casing string is typically cemented in place to protect the borehole and to prevent fluids from seeping along the exterior of the casing. The completion string is placed inside the casing string to serve as a flow path for fluids from the formation, and may include packers to seal off the annulus around the completion string, valves to regulate fluid flow, and sensors to monitor downhole conditions. The service string is temporarily placed inside the completion string to position tools and materials for operations such as operating completion tools (e.g., setting packers, opening valves), perforating the casing, acidizing the formation, and/or fracturing the formation.

The tool systems for downhole completion and servicing have grown more complex as companies demand higher efficiencies in oilfield operations. For example, companies want to maximize the number of operations performed on each string's trip into a borehole. This maximization requires multiple tools to be integrated into a complex system. Moreover, the higher efficiency requirements often mean that only a short time is available for tool system design and assembly. It would be desirable to provide a system and method for downhole tool system development that would prevent these complexity and time constraint issues from harming service quality.

BRIEF DESCRIPTION OF THE DRAWINGS

While the invention is susceptible to various modifications and alternative forms, specific embodiments thereof are shown by way of example in the drawings and will herein be described in detail. It should be understood, however, that the drawings and detailed description thereto do not limit the invention to the particular form disclosed. To the contrary, the drawings and descriptions are intended to disclose and enable all modifications, equivalents and alternatives falling within the spirit and scope of the present invention as defined by the appended claims. In this context:

DETAILED DESCRIPTION

Figure 1:
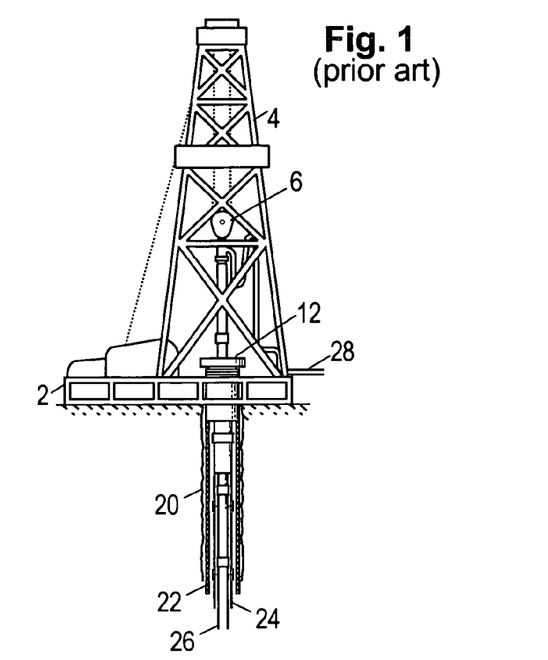
FIG. 1 shows a representative well environment.

FIG. 1 shows representative well environment in which a drilling platform 2 is equipped with a derrick 4 that supports a hoist 6. After a borehole 20 has been drilled, casing 22 is inserted to preserve it, and usually fixed in place using cement. A completion string 24 is lowered inside the casing 22 to provide a flow path for formation fluids, and it may be provided with packers to seal the annulus between the casing and the completion string. Other completion tools may be included in the completion string such as subsurface safety valves, sliding side doors, screens, landing nipples, etc.

FIG. 1 further shows a service string 26 suspended from the hoist 6 that is used to lower the service string through the well head 12. The service string 26 may provide tools such as shifting tools, multi-positioning tools, weight-down indicators, and other service tools. Acidizing or propant fluids for servicing operations may be pumped through supply pipe 18 down through the interior of service string 26.

The assemblage of service and completion tool systems, each comprising multiple tools that can switch into different configurations, creates a combinatorial set of possible interferences. Servicing companies have run into problems with service tools getting stuck in completion tools. The systems and methods disclosed herein for downhole tool system development enable interaction between different tool systems to be analyzed before their actual assembly and deployment. In this manner, expensive and embarrassing interaction problems can be avoided.

The disclosed systems and methods for downhole tool system development can be embodied as a computer system operating in accordance with software stored in memory. In some embodiments, the software takes the form of a web browser accessing downhole tool system development pages. The pages may include Flash multimedia applets and Viewpoint applets that interact via Javascript and XML files. In other embodiments, the software takes the form of a dedicated graphical user interface for developing downhole tool systems from databases of existing tool information.

Figure 2:
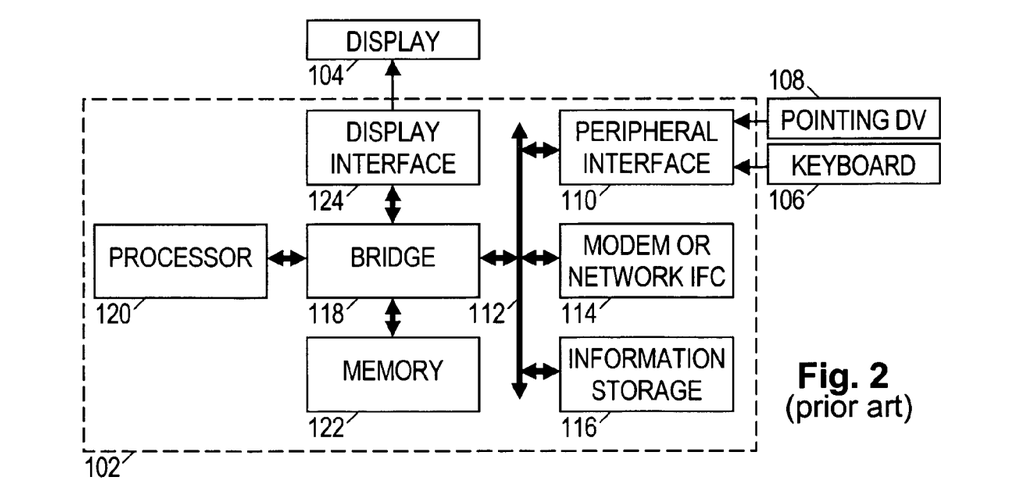
FIG. 2 shows a block diagram of an illustrative computer system.

FIG. 2 shows a block diagram of an illustrative computer 102. The computer 102 couples to a display 104 and one or more input devices such as a keyboard 106 and a pointing device 108. Software running on computer 102 configures the computer to interact with a user via the input devices and display. Information carrier media such as internal storage devices, portable disks or other storage devices, and network connections, can make such software available for execution by the computer.

Input devices 106, 108 are coupled to a peripheral interface 110 that accepts input signals and converts them into a form suitable for communications on internal bus 112. Bus 112 couples peripheral interface 110, a modem or network interface 114, and an internal storage device 116 to a bus bridge 118. Bridge 118 provides high bandwidth communications between the bus 112, a processor 120, system memory 122, and a display interface 124. Display interface 124 transforms information from processor 120 into an electrical format suitable for use by display 104.

Processor 120 gathers information from other system elements, including input data from peripheral interface 110 and program instructions and other data from memory 122, information storage device 116, or from a remote location via network interface 114. Processor 120 carries out the program instructions and processes the data accordingly. The program instructions can further configure processor 120 to send data to other system elements, including information for the user which can be communicated via the display interface 124 and the display 104.

Processor 120, and hence computer 102 as a whole, operates in accordance with one or more programs stored on information storage device 116. Processor 120 copies portions of the programs into memory 122 for faster access, and can switch between programs or carry out additional programs in response to user actuation of the input device. The methods disclosed herein can take the form of one or more programs executing in computer 102. Thus computer 102 can carry out the downhole tool system development processes described with respect to the following figures.

Figure 3:
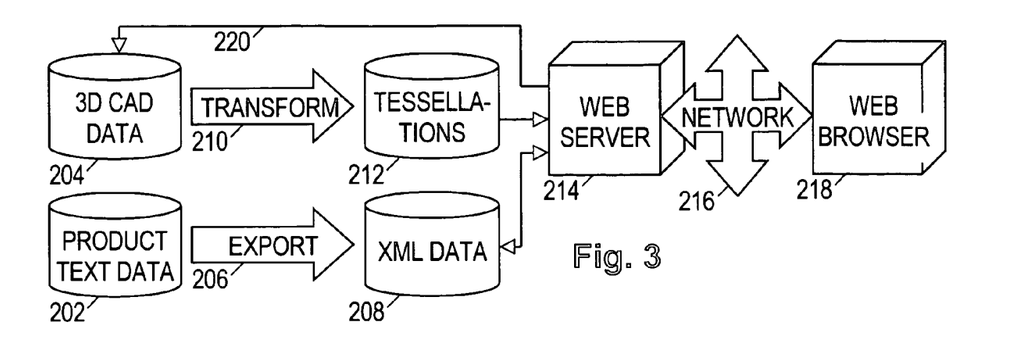
FIG. 3 shows an illustrative downhole tool system development software architecture.

An illustrative system architecture is shown in FIG. 3. A product database 202 comprises textual information about available downhole tools. It is these downhole tools that may be combined to form completion tool systems is completion string 24 and service tool systems in service string 26. The textual information may include product names, product classes, product descriptions, product availability, and engineering details such as weight, dimensions, components, materials, temperature ratings, service requirements, design and revision numbers, etc. A design database 204 comprises three dimensional (3D) computer aided design (CAD) models of at least some of the available downhole tools from database 202. The 3D CAD models specify very precisely the shape and dimensions of each tool component, along with the assembly of components that forms each downhole tool.

Each database 202 and 204 may be unsuitable as a source of information for a web-based system and method of downhole tool system development. Product database 202 may have excessively complete information in predefined data structures that vary between product classes. The 3D CAD database 204 may be incomplete in that models may not exist for every available product. Moreover, the models that do exist may be large and difficult to convert into displayable images. Accordingly, FIG. 3 shows an export process 206 that captures selected data from product database 202 and stores the data in the form of XML ("extended markup language") files in XML database 208. The selected data comprises product name, product class, a short description, a basic set of dimensions (inner diameter, outer diameter, and length), and component information such as materials and basic dimensions of the components. The data in each XML file is delimited using tags that identify the data.

FIG. 3 further shows a transform process 210 that converts 3D CAD models from database 204 into tessellated images that are stored in a tessellations database 212. Tessellated images are a type of 3D model in which the surfaces of three dimensional objects are represented using connected polyhedrons (such as triangles). Tessellated images lend themselves to relatively fast rendering. In some embodiments, the transform process 210 generates tessellations with cut-away sections to enable viewing of inner portions of the modeled objects.

Product database 202 and 3D CAD database 204 are updated as products are revised and new products are developed. Processes 206 and 210 can be run periodically (e.g., on a daily basis) to keep XML database 208 and tessellations database 212 current. Alternatively, processes 206 and 210 can be run on an as-needed basis whenever databases 208 and 212 lack current information about a requested tool.

A web server 214 provides a software interface to the XML database 208 and the tessellations database 212. The software interface responds to TCP/IP- (transmission control protocol/internet protocol-) based communications received via a network 216 from a web browser 218 running on a computer 102. The communications may take the form of HTML (hyper-text markup language) web pages that invoke Java applets such as Flash and Viewpoint. As discussed further below, these web pages enable the development of downhole tool systems. The downhole tool systems can then be tested, dimensioned, saved (in XML database 208), and printed.

New downhole tools may be specified within the interface and the specifications may then be provided as feedback 220 to the 3D CAD database as a basis for the engineers' development of new 3D CAD models. The feedback 220 may additionally comprise XML representations of downhole systems that allow the engineers to automatically construct full CAD models of the tessellated downhole systems created by end-users of the software tools disclosed herein below. These models can then be used by the engineers to perform checks of tolerances, materials compatibilities, etc.

Where new downhole tools have been specified, full CAD information for those tools will not yet exist in 3D CAD database 204. Accordingly, the full CAD downhole system model may have "gaps" where these new downhole tools are meant to reside. The engineers can then simply fill in the gaps to complete the full CAD downhole system model., in the process generating a full CAD model of the new tool. The XML representations provided as feedback 220 may additionally serve to automate manufacturing processes by enabling automatic checking of inventory, automatic ordering of manufacturing supplies when necessary, and automatic initiation of manufacturing processes for needed components.

Figure 4:
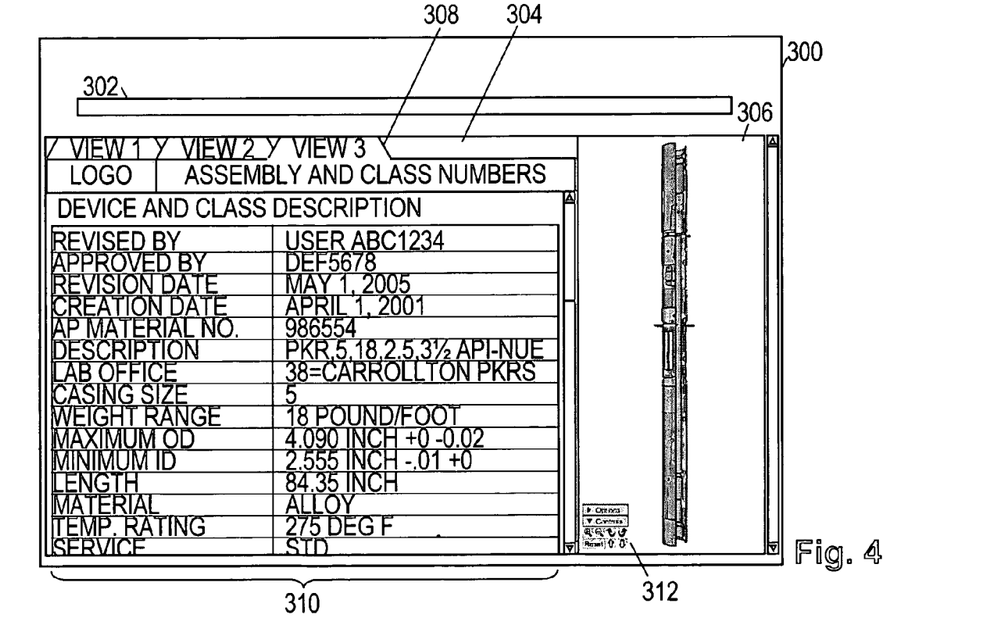
FIG. 4 shows an illustrative display for a downhole tool's textual data.

FIG. 4 shows an illustrative web browser display 300 having a URL (uniform resource locator) field 302. When a URL is specified through manual text entry or by link selection, the web browser retrieves and displays a web page. In this instance, the specified URL provides an advanced materials search (AMS) information screen with a data portion 304 and a graphics portion 306. The information screen presents information regarding a selected downhole tool. The data portion 304 comprises multiple tabs 308 that each provide a particular view of the available textual information, e.g., one view displays only creation and revision information, another view displays only tool-specific information (i.e., class information is suppressed), and a third view displays all available information. In the view shown, assembly and class numbers are provided to identify the selected tool. The assembly and class numbers are followed by a condensed description of the tool and its class, and these in turn are followed by a scrollable list 310 of all available parameters and their values. The graphics portion 306 of the screen shows a cutaway tessellated view of the selected tool and a control panel 312 that enables rotation, scaling, and colorization of the tessellated object.

To generate the view shown, web server 214 draws information from the XML database 208 and the tessellations database 212. If the tessellations database 212 does not include a tessellated image of a selected tool, the web server attempts to find a substitute image by searching the database for another image having the same class number. If such a substitute image is found, web server 214 retrieves dimensional information of the tool represented by the substitute image and scales the substitute image to match the dimensional information of the currently selected tool. The scaled substitute image is then displayed in graphics area 306. If such a substitute image is not found, a two-dimensional drawing may be retrieved from a legacy database and shown in the graphics area 306.

Figure 5:
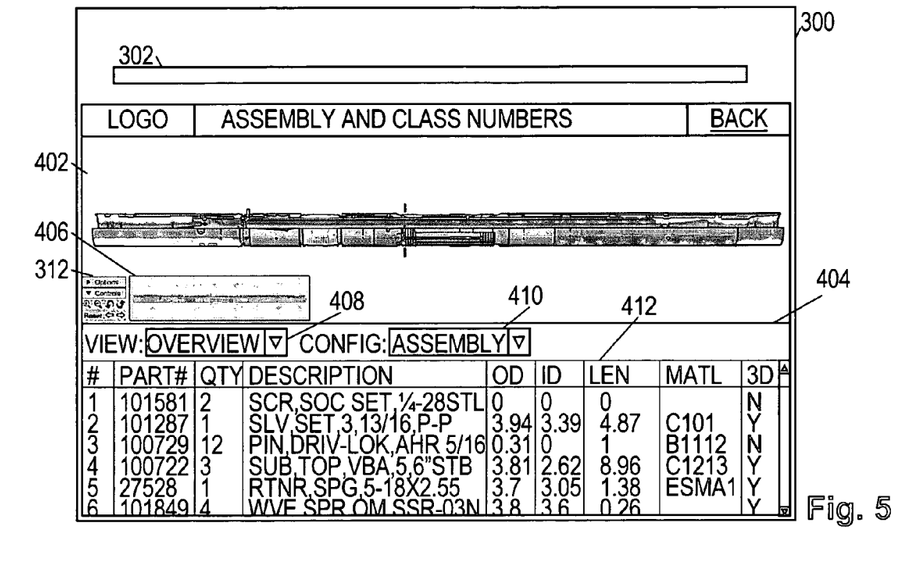
FIG. 5 shows an illustrative display for a downhole tool's components and assembly.

FIG. 5 shows an illustrative web browser display for a bill of materials (BOM) screen. The BOM screen comprises a graphics area 402 and a text area 404. In addition to showing a tessellated image of the selected tool, the graphics area 402 provides a control panel 312 and a context view 406. The context view shows the relative positions of the tessellated image and a viewing window that represents the graphics area 402. The text area 404 comprises a view select-box 408, a configuration select-box 410, and a component list 412. The view select-box 408 offers a number of viewing options for the graphics area 402, including an overview option, a profile option, a moving parts option, and a drawing option. In the overview option, the graphics area 402 shows an overall view of the selected tool. In the profile option, the graphics area shows a close-up detail view of the cut-away area of the selected tool. In the moving parts option, the tessellated image is composed of individually selectable components that can be repositioned by dragging. The user is able to "disassemble" and "reassemble" the selected tool to gain a better understanding of how the components fit and interact. In the drawing option, the graphics area 402 shows a two dimensional drawing with labeled parts.

The configuration select-box 410 enables a user to select any one of the possible configurations the selected tool may have. The list of possible configurations is dependent on the particular tool, but it is contemplated that all tools will have at least an "assembly" configuration, which is the configuration of a fully assembled tool. Tools that have deployable parts will have one or more selectable configuration options that cause graphics area 402 to show the selected tool with those parts deployed.

The component list 412 provides a list of the components in the selected tool. When a component of the selected tool is selected in the graphics area 402, the component list highlights the corresponding element in the component list. Conversely, when an element in the component list 412 is selected, the graphics area highlights the corresponding component(s) of the tessellated image. In some embodiments, the component list comprises a column for each of the following: part number, quantity, description, outer diameter, inner diameter, length, material, and an indication of whether it is shown in the tessellated image. Some parts (e.g., screws) may be omitted from the 3D image and shown only in the two dimensional drawings.

Figure 6:
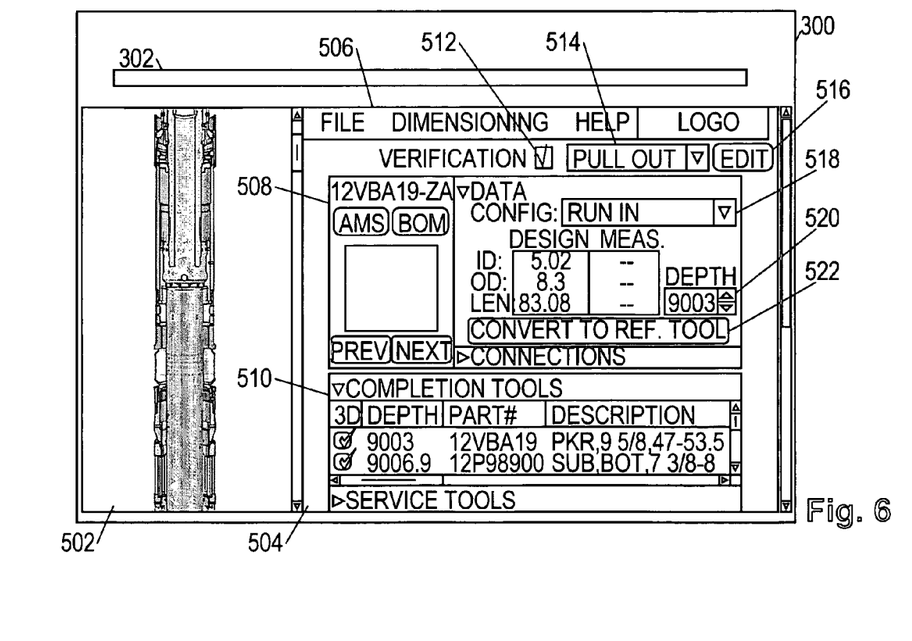
FIG. 6 shows an illustrative display for downhole tool system development.

FIG. 6 shows an illustrative web browser display for a downhole tool system development screen. The development screen comprises a graphics area 502 and a work area 504. Graphics area 502 shows a cut-away view of a currently selected downhole tool in the context of the overall downhole tool system. Though FIG. 6 shows only a single tool string, the downhole tool system may comprise multiple strings, e.g., casing, a completion string, and a service string.

Figure 7:
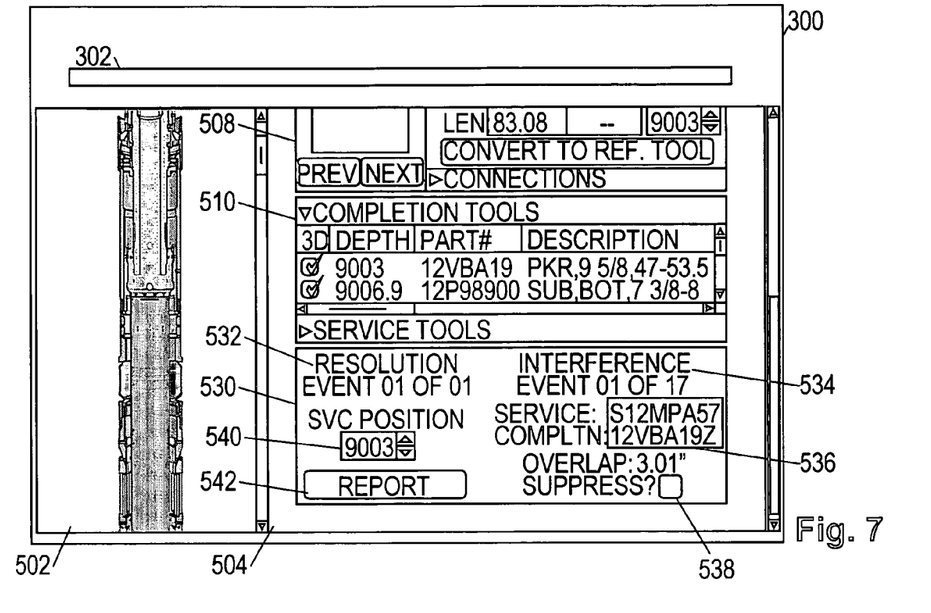
FIG. 7 shows another view of the illustrative display of FIG. 6.

The work area 504 comprises a menu 506, a tool information area 508, a string information area 510, and a system integration testing area 530 (FIG. 7). The menu 506 offers a file submenu that enables saving and retrieving of downhole tool systems in a local system or on the web server 214 (FIG. 3). The dimensioning submenu opens a dimensioning interface such as that described further below with respect to FIG. 11. The help submenu enables access to information on the use and features of the software.

Below menu 506, a verification check box 512 enables or disables thread compatibility checking while the downhole tool assembly is being assembled. A selection box 514 enables selection of various operations that can be performed on the strings in the downhole tool assembly, e.g., pulling the innermost string out of the borehole, or inserting an innermost string into the borehole. An edit button 516 opens a window where parameters of the selected operation can be specified and the operation initiated. Parameters may include starting depth, direction of motion, and a distance for the string to travel.

Tool information area 508 has a left portion and a right portion. The left portion the part number of the currently selected downhole tool, a thumbnail image of the tool, and a set of buttons. In some embodiments, the buttons include "previous" and "next" buttons to select adjacent tools in the current string. The buttons further include an AMS button to open an information screen such as that shown in FIG. 4, and a BOM button to open a BOM screen such as that shown in FIG. 5.

Figure 8:
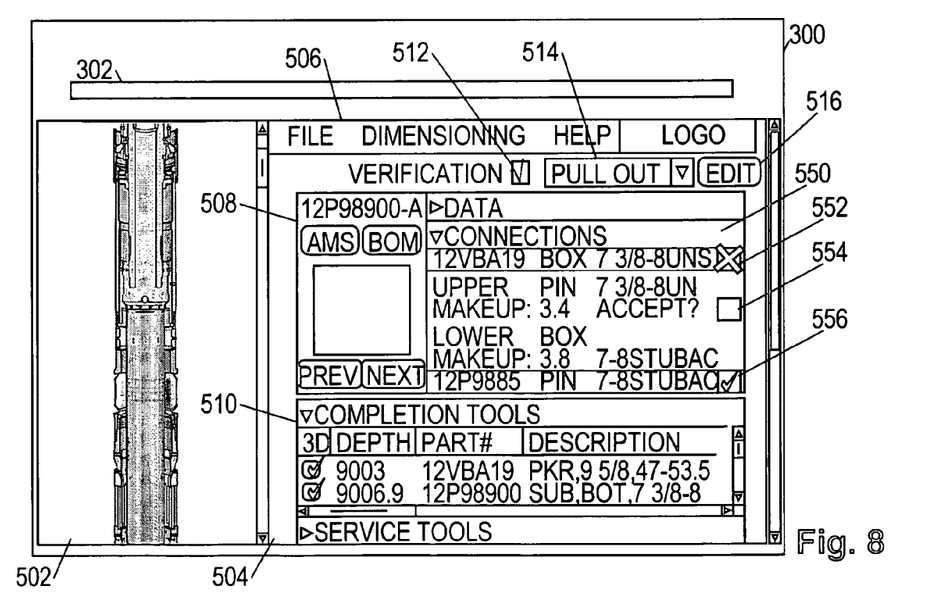
FIG. 8 shows yet another view of the illustrative display of FIG. 6.

The right portion of tool information area 508 has a data view (FIG. 6) and a connections view (FIG. 8). In the data view, right portion shows a configuration selection box 518, basic dimensional information, a depth entry box 520, and a conversion button 522. As in the BOM screen, the configuration selection box 518 enables selection of any available configuration for the current tool. The basic dimensional information includes inner diameter, outer diameter, and length. In some embodiments, the user is allowed to enter measured dimensions for the given tool, and when present, such dimensions are used for the integration testing rather than the design dimensions. The depth entry box 520 enables a user to specify a depth for the current tool. In some embodiments, adjusting the depth causes the whole string to be repositioned.

The conversion button 522 converts the currently selected tool into a reference tool, i.e., a hypothetical tool with adjustable dimensions. The conversion button 522 also opens a new window to enable a user to enter basic dimensional information. In the graphics area 502, the originally selected tool is scaled to match the new dimensions. Reference tools may be used when a particular tool is needed but has not yet been designed. In such circumstances, the user re-dimensions an existing tool to serve as a stand-in for the new tool. In some embodiments, the new tool information is submitted to engineering as the basis for a new tool design.

In the connections view (FIG. 8), the right portion of tool information area 508 shows information regarding the connections of the current tool and the relevant connections of the adjacent tools. The connection information includes the connection gender ("pin" or "box"), the thread type (e.g., 7 3/8-8 UN), and the make-up length (i.e., the distance that the threaded connections will overlap when the connection is securely made). If the connection does not match that of the adjacent tool, a mismatch symbol is shown. In FIG. 8, a mismatch symbol 552 is shown because the thread type of the next tool (7 3/8-8 UNS) does not literally match the upper thread type of the current tool (7 3/8-8 UN). Nevertheless, these thread types are compatible, and a user can so indicate by selecting the accept check box 554. When the connections do match, a match symbol 556 is shown.

The string information area 510 provides a list of tools that make up each string. At the bottom of each list is a button to add a new tool to the string. Once added, each element of the list can be re-ordered to customize the downhole tool assembly. The list includes a set of columns to provide information regarding each tool. The columns may include among other things a 3D indicator, a depth value, a part number, and a description. As items in the list are selected, the corresponding tool is highlighted in the graphics area 502 and the tool information area 508 is updated to reflect information about that tool. Conversely, when items in the graphics area are selected, the corresponding list item is highlighted and the tool information area is updated to reflect information about the current tool. In some embodiments, the color of the 3D indicator indicates whether the corresponding tessellated tool image in the graphics area is derived from the CAD models of the currently selected tool, derived from the CAD models of a different tool in the same family, or simply a scaled image of a reference tool.

FIG. 7 shows a system integration testing (SIT) area 530. The SIT area has a resolution portion 532 and a interference portion 534. The interference portion 534 shows the number of detected interference events and details 536 regarding the current interference event, and a suppress check box 538 that enables a user to have the interference event ignored (e.g., when the interference merely represents the compression of a seal ring). In some embodiments a text entry box is provided for users to enter comments relating to their decision to suppress an interference event. When the user first initiates a operation 514, a check is made for any collisions between different tools in the current position.

The collision detection process may simply comprise a comparison of ID and OD measures of all tools having overlapping lengths in different strings to make sure that inner tools will fit within outer tools. (Programmable radial and axial tolerances may be incorporated to allow room for error.) More sophisticated, solid-model graphics-based methods may alternatively be employed to detect collisions.

If no collisions are detected, the innermost string is moved while the software monitors the tools for any collisions. The details 536 are provided for any detected collisions and the user is given an opportunity to resolve each collision. In some embodiments, the details include parts numbers of the two tools that have collided, and the amount of the diametrical overlap between tools.

The resolution portion 532 shows resolution events, i.e., actions taken by the user to resolve interference events. An example of such an event is changing the configuration of a selected tool to eliminate the collision. In some embodiments, the resolution events do not include suppressing interference events. The actions taken by a user for a given position 540 of the innermost string are grouped together as a single resolution event. A report button 542 is provided to display a detailed report regarding the resolution events. An example of such a report will be described further below with respect to FIG. 10.

Figure 9:
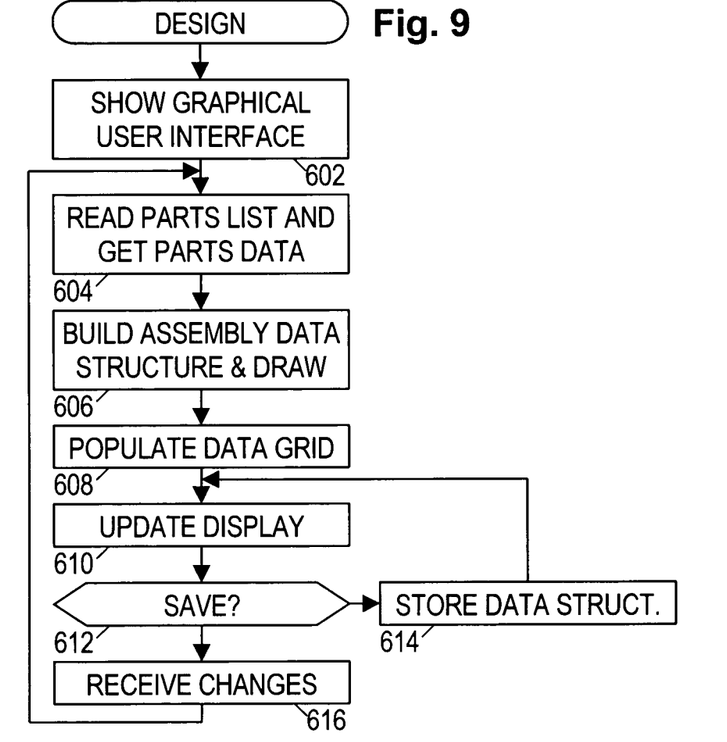
FIG. 9 shows a flowchart of an illustrative downhole tool system development method.

FIG. 9 shows a flow diagram of a downhole tool system development method that employs a graphical user interface such as that shown in FIGS. 6-8. The method begins with block 602, when a graphical user interface (e.g., FIG. 6) is displayed. In response to user input, a file is identified and opened, and in block 604 the software retrieves the identity and arrangement of tools in the downhole tool system. For a new tool system, the list of tools will be kept empty. In block 606, tessellated images for the tools are retrieved from a database, and a data structure is constructed to describe how the overall downhole tool system is to be displayed. The data structure and tessellated images are passed to a rendering tool (such as Viewpoint) to draw an image of the downhole tool system. In block 608, a data grid is populated for the graphical user interface, so that in block 610, the graphical user interface displays the relevant information about the tool system. The graphical user interface is dynamic so that, e.g., the interface displays tool information as different tools are selected, string information as the downhole tool system is assembled, and integration testing information as various operations are simulated.

In response to user inputs, a check is made in block 612 to determine whether the user wishes to save the current downhole tool system. If so, then in block 614, the software stores the information regarding the downhole tool system in a file. Otherwise, in block 616, the software responds to view changes, tool additions, tool removals, repositioning commands, a problem resolutions, by capturing the commands in block 616 and repeating previous steps with the changes incorporated.

Figure 10:
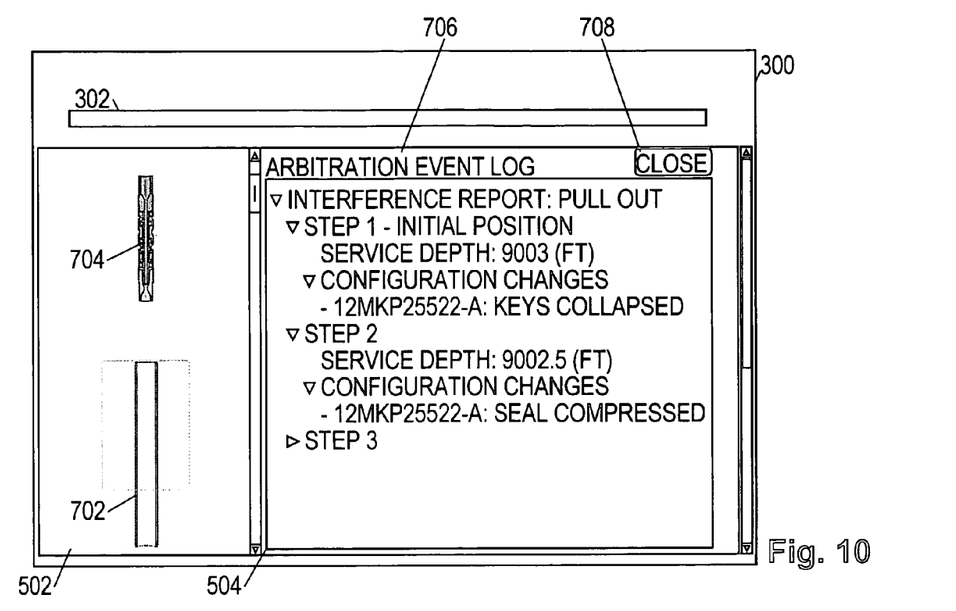
FIG. 10 shows an illustrative display for reporting events in simulated downhole tool system operation.

FIG. 10 shows an illustrative browser display for a detailed report regarding resolution events. The detailed report comprises a log of actions taken by the user to resolve interference events. In FIG. 10, the graphics area 502 shows a service string 704 that has been pulled from a completion string 702. The work area 504 shows a log 706 and a close button 708. The user can show or hide the details available for each individual step, and once done with perusing the report, close the report with the close button 708. The details available for each step include a depth value that indicates the position of the innermost string in the downhole tool system, and further include any changes to the configuration state of individual tools in the downhole tool system.

Figure 11:
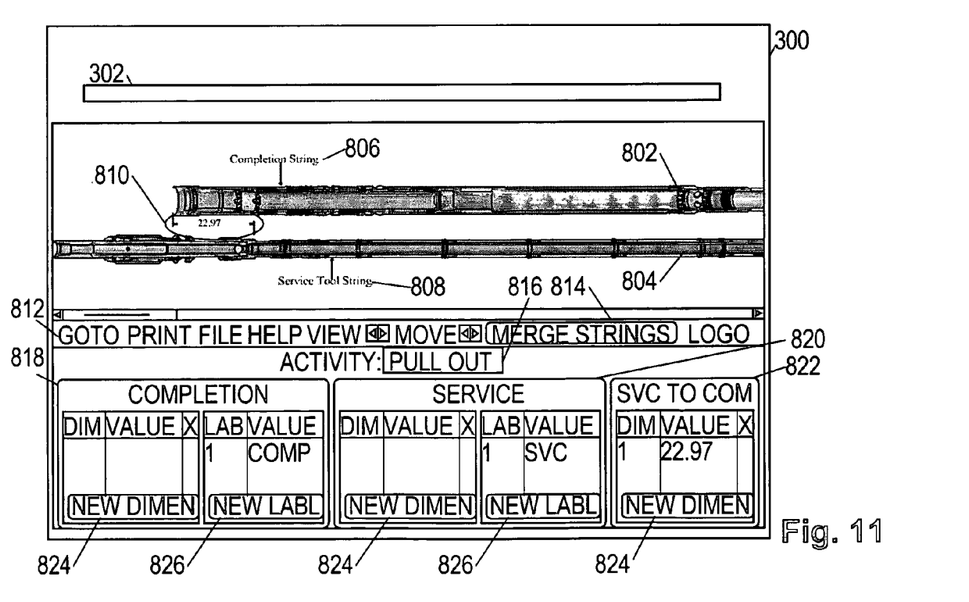
FIG. 11 shows an illustrative display for labeling and dimensioning a downhole tool system.

FIG. 11 shows an illustrative browser display for dimensioning and labeling portion of a downhole tool system. A graphics area shows a completion string 802, a service tool string 804, and various labels 806, 808 and dimensions 810. A text area shows a menu 812, a merge button 814, and activity selection box 816, and work areas 818, 820 and 822. The work areas are used to add labels and dimensions to highlight features and expected arrangements of the downhole tool system.

Menu 812 includes a goto submenu, a print submenu, a file submenu, a help submenu, and view controls. The goto submenu enables a user to set the view window to a given position on the downhole tool system. The print submenu enables a user to print a hardcopy of the dimensioned and labeled downhole tool system image. The file submenu enables a user to save and retrieve dimensioned and labeled downhole tool systems. The help submenu provides access to information for using the dimensioning and labeling interface. The view control enables a user to adjust the viewed portion of the downhole tool system, and the motion control causes relative motion between the completion and service strings. Merge button 814 toggles the state of the strings. When merged, the service tool string is drawn inside (and coaxial with) the completion string. When separated, the strings are shown side-by-side as shown in FIG. 11.

Activity selection box 816 enables the user to select an operation (see box 514, FIG. 6), which defines the initial relative position of the strings in the graphics area. Work area 818 corresponds to completion string 802, and it specifies the dimensions and labels associated with the completion string. A new dimension button 824 and a new label button 826 are provided to add new dimensions and labels, respectively to the completion string. Pressing the dimension button 824 creates two dimension limits that the user can position and reposition on the completion string. A distance measurement is made automatically and specified on the drawing. Similarly, pressing the label button 826 creates a label lead line that the user can position and reposition on the completions string, and a text entry field is provided for the user to enter the desired label contents. Tables within the work area 818 identify the existing dimensions and labels, and these can be individually deleted if desired. Work area 820 operates similarly for the service string, and work area 822 works similarly for inter-string dimensions.

Figure 12:
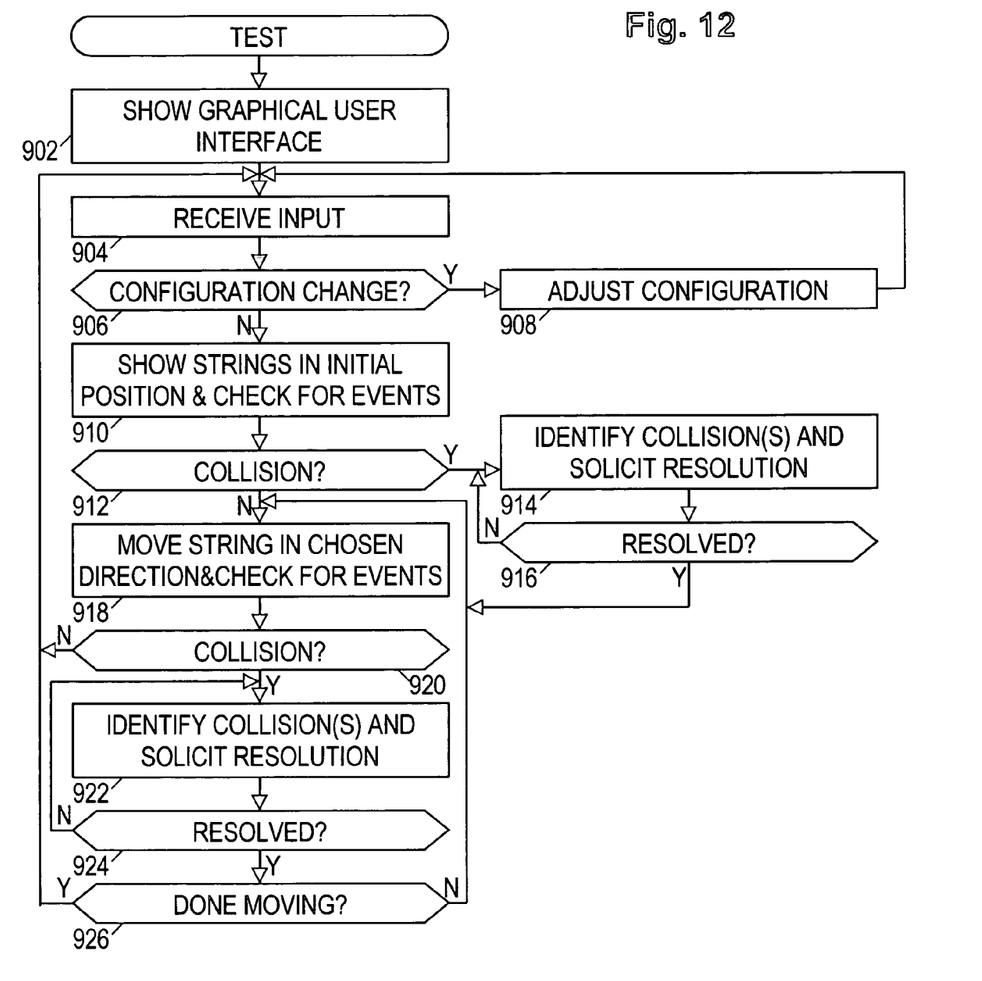
FIG. 12 shows a flowchart of an illustrative downhole tool system simulation method.

FIG. 12 shows a flow diagram of an illustrative method for simulating operations in a downhole tool system. In block 902 the software shows a graphical user interface (e.g., FIGS. 6-7) from which a user can initiate a simulated operation (see, e.g., the description of select box 514 above). In block 904, the software receives user input, and in block 906 the software checks to determine whether the input is a change in a tool's configuration. If so, in block 908, the software adjusts the tool configuration and returns to block 904.

If the input is the selection of a simulated operation (e.g., pulling the innermost string from the borehole), the software begins in block 910 by showing the strings of the downhole tool system in an initial position and constructing a list of all interference events between tools. In block 912, the software determines whether the list is empty, and if not, displays the collisions one at a time in block 914 to solicit a resolution of the interference event. Each action is evaluated in block 916 to determine whether the list of interference events have been resolved, and if not, block 914 is repeated.

Once the initial position is determined to be interference-free, in block 918 the software simulates the motion of the innermost string in the desired direction and monitors for collisions between tools. In block 920 the software tests whether a collision has been detected or whether the string has been moved to the target position without a collision. If the motion was collision-free, a success report is displayed and the software returns to block 904. Otherwise, in block 922, the software displays the collision(s) one at a time to solicit a resolution of the interference event. Each action is evaluated in block 924 to determine whether the collision(s) have been resolved, and if not, block 922 is repeated.

Once any detected collisions have been resolved, in block 926 the software determines whether additional motion is needed to complete the operation. If so, the software returns to block 918. Otherwise, the software displays a completion message and returns to block 904.

Figure 13:
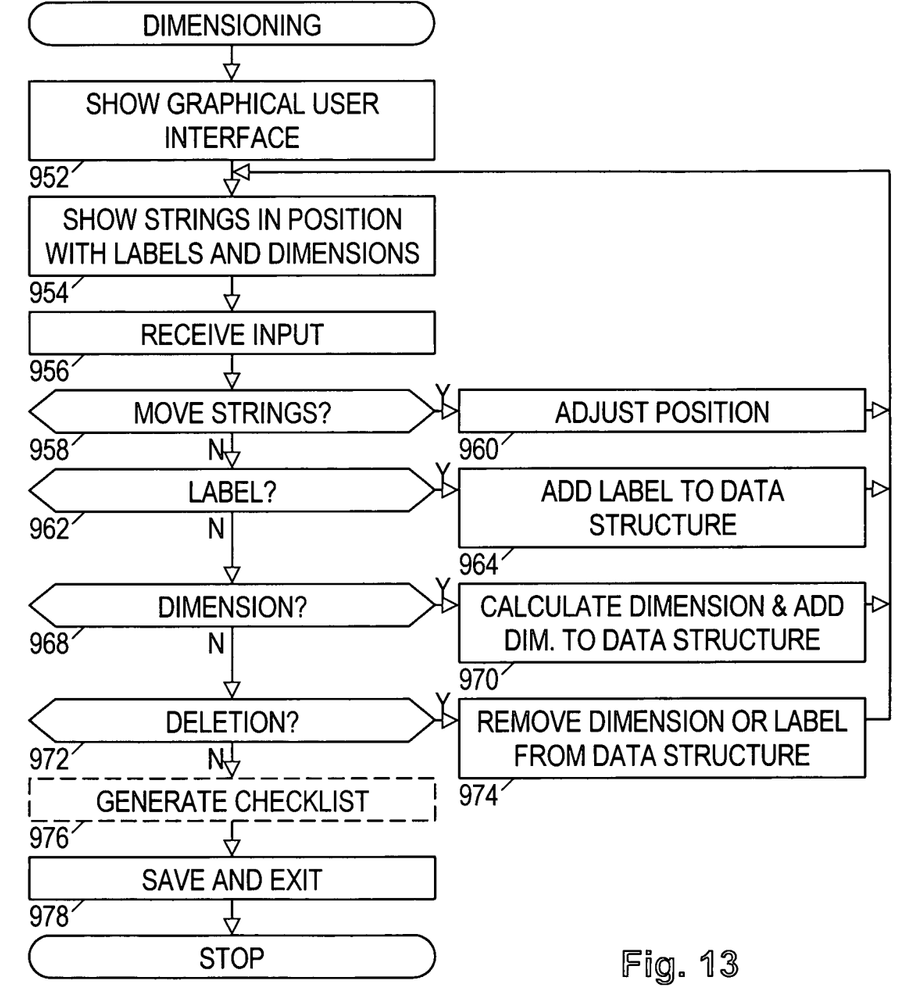
FIG. 13 shows a flowchart of an illustrative downhole tool system dimensioning method.

FIG. 13 shows a flow diagram of an illustrative dimensioning method. In block 952 the software shows a graphical user interface (e.g., FIG. 11). In block 954, the software shows the strings of the downhole tool system in an initial position with any previously provided labels and dimensions. In block 956, the software receives user input and evaluates it in blocks 958, 962, 968, and 972. In block 958, the software determines whether the input is an instruction to adjust the relative position of the strings, and if so, the software adjusts the strings' positions. In block 962, the software determines whether the input is an instruction to add a label, and if so, the software, in block 964, adds a label to the appropriate part of a data structure describing how the downhole tool system is to be displayed. In block 968, the software determines whether the input is an instruction to add a dimension, and if so, the software, in block 970, calculates a distance between limits and adds the dimension to the display data structure. In block 972, the software determines whether the input is an instruction to delete a label or dimension from the display, and if so, the software deletes the dimension or label from the display data structure. After any of the foregoing inputs, the software returns to block 954.

For other inputs, e.g., a save command, the software, in block 976, optionally generates a hard copy of the labeled and dimensioned downhole tool system with a checklist for verifying dimensions. A hardcopy can be generated for each of multiple tool system positions and states. In block 978 the software saves a data structure specifying the downhole tool system components, positions, and any added labels and dimensions.

The foregoing disclosures provide for checking of geometrical compatibility during service string insertion and removal operations. The operability checking can be extended to include verifying fluid and mechanical dynamics of the Downhole components. In the context of fluid dynamics, the outer diameter and inner diameter information of the tubular strings may be combined with valve and aperture information about particular tools to identify potential fluid flow paths. Information about fluid characteristics such as density and viscosity can be used to analysis hydraulic affects on Downhole components.

In the context of mechanical dynamics, borehole geometries may be modeled to verify that multiple strings will satisfy stress/strain and bending radii requirements. Some downhole tools are activated or moved by hydraulic or mechanical manipulation. Such fluid and mechanical dynamics verifications are preferably provided to a user via the light-weight visualization interfaces disclosed hereinabove.

The tools disclosed herein enable new business workflow processes. An end-customer, when provided access to these tools, is able to perform catalog searching to identify desired downhole tools. For any downhole tools that the customer desires but cannot find, the customer can provide specifications of a hypothetical tool. The customer is then able to assemble existing downhole and hypothetical tools into a complete downhole system including a completion string and a service string. Having assembled the complete downhole system, the customer can then use the disclosed software tools to verify the desired interconnections and interoperability of the various downhole system components. A log of configuration changes during simulated operations of the system can be saved as a basis for the downhole system's formal operating protocol. Dimensions for the system in different positions can be measured and saved for future reference. The customer can place a request for a quote on the downhole system. In addition, the disclosed software tools may enable a customer to submit specifications of a hypothetical tool to the engineering group as the basis of a downhole tool to be created specifically for the customer.

Each of the foregoing operations can alternatively be performed by a consultant working with the customer to determine a solution for the customer's needs or a marketing person demonstrating available technology and applications of that technology to a general market. The consultant or marketer may additionally process the request for quote through quotation software that determines downhole tool availability and an overall price with or without adjustments for rush jobs, destination taxes, customer discounts, etc.

Engineers may receive XML representations of downhole systems and component specifications from users of the disclosed tools, and indeed, the engineers may use the disclosed software tools themselves as a preliminary step to authoring downhole tool and system specifications in an industrial CAD/CAM software package. The engineers can import existing CAD/CAM files for specified components, configured as specified in the XML representation. The engineers may then "fill in" any gaps caused by use of hypothetical tools, greatly speeding their task.

Once a purchase agreement has been made, manufacturers may receive XML representations of the downhole systems, from which needed materials and components can be automatically determined. Those materials or components not in inventory can be automatically ordered or their manufacturing automatically initiated.

Delivery and assembly personnel can be provided with configuration and dimensioning information from the disclosed software tools. This information can be used for assembly and checking of the downhole system. Once a downhole system has been delivered and deployed, a support team may use the disclosed tools to test alternative configurations and operations of the downhole system. Moreover, the disclosed software tools may be used for training consultants, marketers, engineers, manufacturers, assembly, and support personnel on the available technology and operation thereof.

Each of the foregoing business workflow processes can be formalized as a business method, implemented in a networked computer system, and/or incorporated into a enterprise application software package. The disclosed methods may be embodied in an information carrier medium that, when placed in operable relation to a computer, provides the computer with software comprising a downhole tool development system. The disclosed embodiments are expected to be useful for performing virtual completion design and systems integration checks prior to actual physical installations. Virtual design and systems integration test capabilities can increase efficiency in the completion decisions making process and tool design as well as identify and eliminate potential problems which could result in costly overruns. The use of tessellated images rather than CAD models drastically reduces rendering times from hours to seconds, and the suggested architecture allows the images to be current with the latest engineering changes and revision level controls, while simultaneously enabling remote access. Reference tools can be used to represent competitors' equipment and customer-specific accessories. The visual component of the disclosed methods enable fast and intuitive downhole tool system proposals for customers.

Numerous variations and modifications will become apparent to those skilled in the art once the above disclosure is fully appreciated. It is intended that the following claims be interpreted to embrace all such variations and modifications.

What is claimed is:

1. A method of downhole tool system development that comprises:
   receiving electronic specifications of a downhole tool system that comprises multiple strings including an inner string for placement within an outer string, each of the inner string and the outer string having one or more components; and
   checking the received specifications by a downhole tool system development software stored in a memory and executing on a processor for operation-induced interference between the inner string and the outer string.

2. The method of claim 1, wherein the operation is insertion or removal of the inner string.

3. The method of claim 1, wherein the specifications include basic dimensions for each component, said basic dimensions comprising a minimum inner diameter, a maximum outer diameter, and a length.

4. The method of claim 3, wherein said checking comprises:
   determining a relative string position of the inner string with respect to the outer string;
   using component lengths to determine radially adjacent components; and
   comparing the maximum outer diameters of components of the innermost string to the minimum inner diameters of radially adjacent components of the outer string.

5. The method of claim 4, further comprising:
   soliciting user input to resolve any detected interference or collision.

6. The method of claim 5, further comprising:
   determining whether the user input indicates a change in a component's configuration, and if so, changing the component's configuration in response to the user input; and
   determining whether the configuration change resolves the detected interference or collision, and if so, proceeding to a subsequent interference or collision.

7. The method of claim 5, further comprising:
   recording resolution events as a function of a string's position; and
   generating a report of resolution events as a function of the inner string's position.

8. The method of claim 1, further comprising:
   retrieving images for said components;
   constructing a downhole tool system image by assembling component images; and
   displaying the downhole tool system image.

9. The method of claim 8, wherein said retrieving includes:
   retrieving images of said components if images are available; and
   for each component not having an available image,
      retrieving an image of another component in a product class containing the component not having an available image; and
      scaling the image to match basic dimensions of the component not having an available image.

10. The method of claim 8, further comprising:
   receiving labels and dimensions associated with the downhole tool system; and
   displaying the downhole tool system image with said labels and dimensions.

11. The method of claim 1, further comprising:
   checking connection compatibility between axially adjacent components of each string; and
   displaying an indication of whether axially adjacent components have compatible connections.

12. The method of claim 1, further comprising:
   displaying a separate image of a component in the downhole tool system; and
   displaying a list of materials that make up the component.

13. The method of claim 12, wherein the image comprises images of the individual materials that make up the component, and wherein the images of the individual materials can be individually repositioned by a user to disassemble the component.

14. A system for downhole tool system development that comprises:
   memory that stores software; and
   a processor coupled to the memory to execute the software, wherein the software causes the processor to:
      provide a graphical user interface that enables a user to specify a downhole tool system having multiple strings including an inner string for placement within an outer string, each of the inner string and the outer string having one or more tools; and
      test for diametrical overlap between said tools attributable to relative motion of the inner string within the outer string.

15. The system of claim 14, wherein the relative motion represents removal of the inner string from a borehole.

16. The system of claim 14, wherein the processor determines basic dimensions associated with each tool, said basic dimensions including an inner diameter, an outer diameter, and a length.

17. The system of claim 14, wherein the software further causes the processor to notify the user of any detected diametrical overlap and to solicit a user action that obviates the diametrical overlap.

18. The system of claim 17, wherein the user action is a change in tool state that alters a basic dimensions of a tool.

19. The system of claim 17, wherein the software further causes the processor to compile a report of user actions.

20. The system of claim 14, wherein the software further causes the processor to check connection compatibility of said tools.

21. The method of claim 1, wherein checking for operation-induced interference between the inner string and the outer string comprises:
   checking for interference between the inner string and the outer string in an initial position.

22. The method of claim 1, wherein checking for operation-induced interference further comprises:
   checking for both anticipated interference that can be ignored and unanticipated interference that requires a change in the electronic specifications of the downhole tool system.

23. The method of claim 5, wherein the user input comprises input to suppress a detected interference.

24. The system of claim 17, wherein the user action is to ignore the detected diametric overlap.

* * * * *